(12) United States Patent
Terrovitis

(10) Patent No.: US 9,214,431 B1
(45) Date of Patent: Dec. 15, 2015

(54) ON-CHIP/OFF-CHIP MAGNETIC SHIELDING LOOP

(75) Inventor: Manolis Terrovitis, Santa Clara, CA (US)

(73) Assignee: QUALCOMM Incorporated, San Diego, CA (US)

( * ) Notice: Subject to any disclaimer, the term of this patent is extended or adjusted under 35 U.S.C. 154(b) by 2781 days.

(21) Appl. No.: 11/420,461

(22) Filed: May 25, 2006

(51) Int. Cl.
*H01L 29/76* (2006.01)
*H01L 23/552* (2006.01)

(52) U.S. Cl.
CPC ....... *H01L 23/552* (2013.01); *H01L 2924/3025* (2013.01)

(58) Field of Classification Search
CPC ............... H01L 2924/3025; H01L 23/552; H01L 2924/01079
USPC .......... 257/660, 659, 709, 708, 724, 725, 777
See application file for complete search history.

(56) References Cited

U.S. PATENT DOCUMENTS

| | | | | |
|---|---|---|---|---|
| 2,914,735 A * | 11/1959 | Young | ........................... | 332/173 |
| 5,294,751 A * | 3/1994 | Kamada | ........................ | 174/541 |
| 5,955,789 A * | 9/1999 | Vendramin | ................... | 257/786 |
| 6,038,663 A * | 3/2000 | Feldman | ........................... | 713/1 |
| 6,107,684 A * | 8/2000 | Busking et al. | ............... | 257/725 |
| 7,705,433 B2 * | 4/2010 | Lee et al. | ....................... | 257/659 |
| 2003/0174478 A1 * | 9/2003 | Oggioni et al. | ............... | 361/760 |

* cited by examiner

*Primary Examiner* — Michael Shingleton
(74) *Attorney, Agent, or Firm* — Holland & Hart LLP

(57) ABSTRACT

Magnetic coupling of noise sources can have a negative impact on the net performance of sensitive circuits. A magnetic shielding loop can advantageously minimize magnetic coupling associated with a circuit on an integrated circuit (IC) by including on-chip components, off-chip components, and interface components connecting the on-chip and off-chip components. The components can include conductive paths and contact pads on a die, package, and printed circuit board. The magnetic shielding loop magnetically isolates at least one of input terminals and noise-generating elements of the circuit.

9 Claims, 4 Drawing Sheets

ON-CHIP/OFF-CHIP MAGNETIC SHIELDING LOOP

BACKGROUND OF THE INVENTION

1. Field of the Invention

The present invention relates to magnetic coupling and in particular to using on-chip and off-chip components to provide a magnetic shielding loop.

2. Discussion of the Related Art

Magnetic coupling of sources of noise including, by way of example, but not limitation, coherent interference, incoherent interference, and thermal noise, can have a negative impact on the net performance of sensitive circuits, such as low noise amplifiers in a radio receiver. Further, sources of significant energy, such as transmitter outputs, can produce undesirable magnetic coupling to other on-chip or off-chip circuits. As a result, conventional layouts of both on-chip or off-chip circuits have required the introduction of significant spacing around any sensitive or noise-generating circuits to avoid magnetic coupling effects.

Increasingly, electronic designs place a premium on small size. Unfortunately, using large layout spacing to minimize coupling uses valuable board and/or chip area. Therefore, large layout spacing can significantly increase the overall system cost, which decreases system desirability.

SUMMARY OF THE INVENTION

Magnetic coupling of on-chip or off-chip noise sources can have a negative impact on the net performance of sensitive circuits. A structure to minimize magnetic coupling associated with a circuit on an integrated circuit (IC) is described. This structure can include on-chip components, off-chip components, and interface components connecting the on-chip components and off-chip components to form a magnetic shielding loop. The magnetic shielding loop magnetically isolates at least input terminals of the circuit. If the circuit is noise generating, then the magnetic shielding loop can magnetically isolate the whole circuit.

In another embodiment, the structure can include a first conductive path formed in a die of the IC, a second conductive path formed in a package of the IC, and conductive interface components to connect the first and second conductive paths and form the magnetic shielding loop. The conductive interface components can include chip contact pads connected to the first conductive path, package contact pads connected to the second conductive path, and bonding wires connecting the chip contact pads and the package contact pads. Notably, the conductive interface components are already present in the IC. Moreover, the conductive paths can be formed with minimal silicon resources. Therefore, the resulting magnetic shielding loop provides a space-effective solution to the magnetic coupling problem.

In yet another embodiment, the structure can include three conductive paths. The first conductive path can be formed in the die of the IC. The second conductive path can be formed in the package housing the IC. The third conductive path can be formed in a printed circuit board for mounting the IC. Conductive interface components can be used to connect the first, second, and third conductive paths and form the magnetic shielding loop. The conductive interface components can include chip contact pads connected to the first conductive path, package contact pads connected to the second conductive path, bonding wires connecting the chip contact pads and the package contact pads, package solder bumps/contact pads connected to the third conductive path, and conductors connecting the package contact pads and the package solder bumps/contact pads.

Because the die, package, and printed circuit board can be characterized as substrates, a method of minimizing magnetic coupling associated with the circuit can be generally expressed as creating a magnetic shielding loop spanning a plurality of substrates, wherein the plurality of substrates include at least a die substrate and a package substrate. In one embodiment, the plurality of substrates can include a die substrate, a package substrate, and a printed circuit board substrate.

DETAILED DESCRIPTION OF THE FIGURES

In accordance with one aspect of the invention, a magnetic shielding loop can be provided using a conductive loop. This conductive loop can be advantageously formed using multiple substrates. Exemplary substrates include a die, a package that provides an electrical connection between the die and other off-chip devices, and a printed circuit board used to mount the packaged die.

Figure 1:
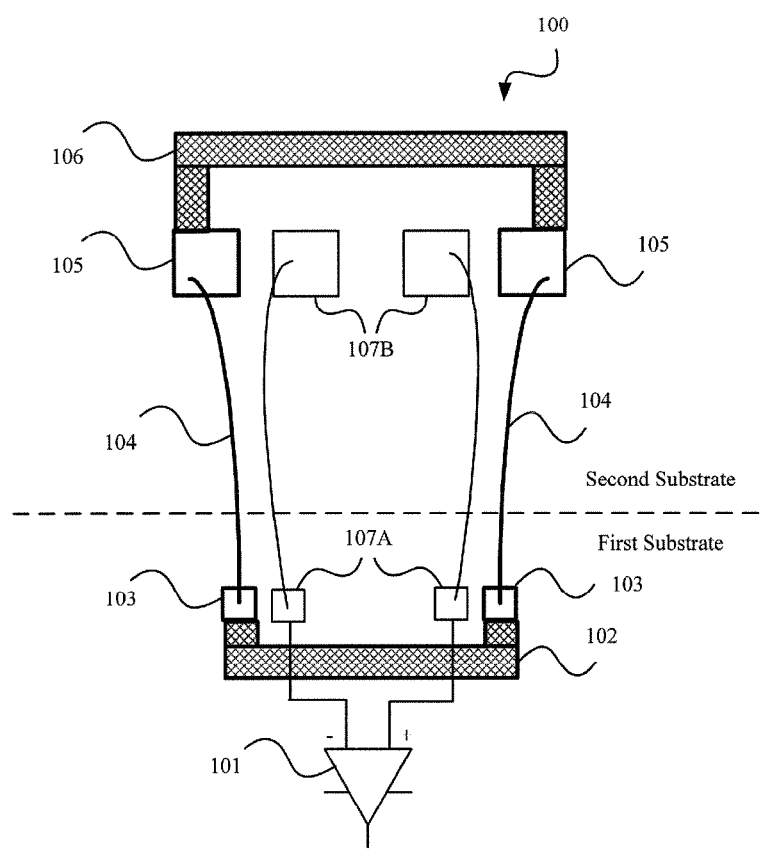
FIG. 1 illustrates an exemplary magnetic shielding loop that can magnetically isolate the inputs to a noise-sensitive circuit using two substrates.

FIG. 1 illustrates an exemplary magnetic shielding loop 100 that can protect the inputs to a noise-sensitive circuit, e.g. a low noise amplifier 101, from magnetic coupling with other on-chip and off-chip noise sources. In this embodiment, magnetic shielding loop 100 can be formed using a first conductive on-chip path 102, a second conductive off-chip path 106, chip contact pads 103 that are connected to first conductive on-chip path 102, package contact pads 105 that are connected to second conductive off-chip path 106, and bonding wires 104 that connect chip contact pads 103 and package contact pads 105. In this embodiment, first conductive on-chip path 102 and chip contact pads 103 can be characterized as being formed with a first substrate (i.e. the die), second conductive off-chip path 106 and package contact pads 105 can be characterized as being formed with a second substrate (i.e. the package), and bonding wires 104 can be characterized as interfacing between the first and second substrates.

Advantageously, magnetic shielding loop 100 can protect input terminals 107A (on-chip)/107B (off-chip) to the noise-sensitive circuit, i.e. low noise amplifier (LNA) 101, from magnetic coupling with noise sources. That is, magnetic shielding loop 100 can provide magnetic isolation for LNA 101. Although LNA 101 could be included within magnetic shielding loop 100 in other embodiments, the predominant sources of magnetic coupling for LNA 101 can be advantageously eliminated by forming magnetic shielding loop 100 around input terminals 107A/107B and their associated bonding wires.

Notably, chip contact pads 103, package contact pads 105, and bonding wires 104 are already present in an integrated circuit (IC). Moreover, conductive path 102 can be formed with minimal silicon resources, whereas conductive path 106 is formed on the second substrate and therefore uses no silicon resources. Therefore, magnetic shielding loop 100 provides a space-effective solution to the magnetic coupling problem associated with LNA 101.

Figure 2A:
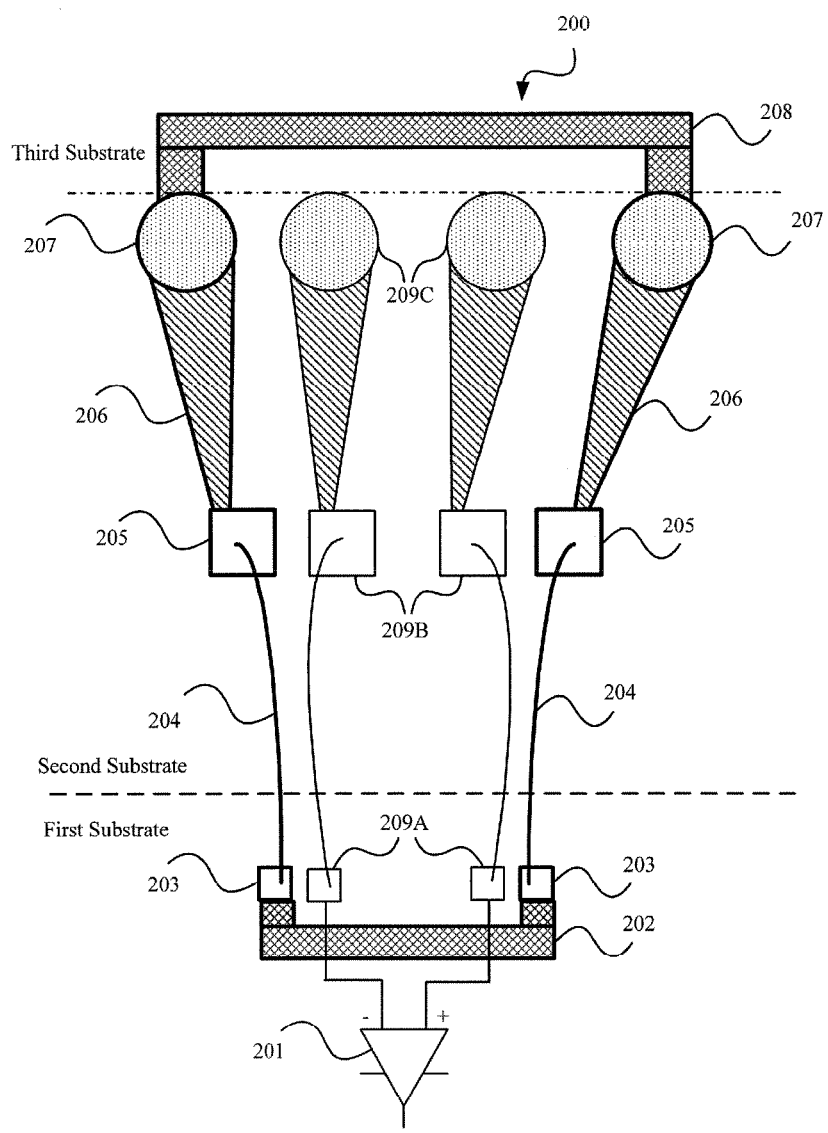
FIG. 2A illustrates an exemplary magnetic shielding loop that can magnetically isolate the inputs to a noise-sensitive circuit using three substrates.

FIG. 2A illustrates an exemplary magnetic shielding loop 200 using three substrates that can protect the inputs to a noise-sensitive circuit, e.g. a low noise amplifier (LNA) 201, from magnetic coupling with on-chip and off-chip noise sources. In this embodiment, magnetic shielding loop 200 can be formed using a first conductive on-chip path 202, chip contact pads 203 that are connected to first conductive on-chip path 202, package contact pads 205, bonding wires 204 that connect chip contact pads 203 and package contact pads 205, package solder bumps/contact pads 207, conductors 206 that connect package solder bumps/contact pads 207 and package contact pads 205, and a second conductive off-chip path 208 connected to package solder bumps/contact pads 207. In this embodiment, first conductive on-chip path 202 and chip contact pads 203 can be characterized as being formed with a first substrate (i.e. the die), package contact pads 205, conductors 206, and solder bumps/contact pads 207 can be characterized as being formed with a second substrate (i.e. the package), bonding wires 204 can be characterized as interfacing between the first and second substrates, and second conductive off-chip path 208 can be characterized as being formed with a third substrate (i.e. the printed circuit board).

Figure 2B:
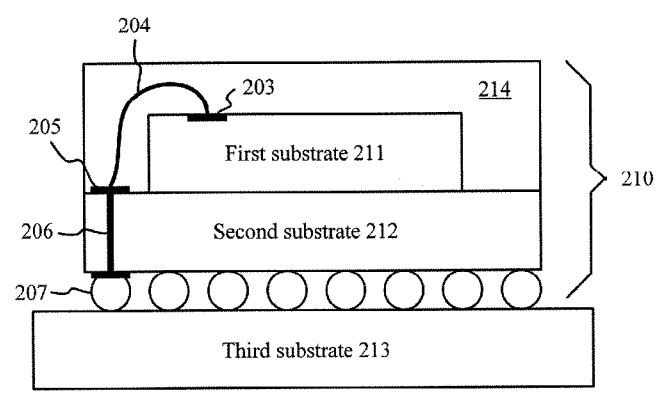
FIG. 2B illustrates a cross-section of the three substrates of FIG. 2A.

FIG. 2B illustrates a cross-section of a wirebond ball grid array (BGA) 210 on a printed circuit board to better show first substrate 211 (and a chip contact pad 203) implementing a die, a second substrate 212 (and a package contact pad 205, a conductor 206, and a package solder bump/contact pad 207) implementing a package, and a third substrate 213 implementing a printed circuit board. Note that although conductor 206 is shown extending vertically to solder bump/contact pad 207, conductor 206 could includes a trace that runs horizontally through at least a portion of second substrate 212. Note further that conductor 206 could be characterized as another conductive path in magnetic shielding loop 200. In typical embodiments, first substrate 211, second substrate 212, chip contact pads, bonding wires 204, and package contact pads 205 are encapsulated in a resin 214 for physical protection.

In other embodiments, other types of packaged integrated circuits can be used with a magnetic shielding loop. For example, a flipchip BGA can also be used with a magnetic shielding loop. In a flipchip BGA, a die has contact pads that are directly bonded to the package using solder bumps.

Referring back to FIG. 2A, magnetic shielding loop 200 can protect the input terminals 209A (on-chip)/209B (off-chip)/209C (off-chip) to the noise-sensitive circuit, i.e. LNA 201, from magnetic coupling with noise sources. That is, magnetic shielding loop 200 can provide magnetic isolation for LNA 201. Advantageously, the predominant sources of magnetic coupling for LNA 201 can be eliminated by forming magnetic shielding loop 200 around input terminals 209A/209B/209C as well as their associated bonding wires and conductors. Note that input terminals 209A/209B/209C could be connected to other components (e.g. baluns, antennas, etc.) without affecting the functioning of magnetic shielding loop 200.

Notably, chip contact pads 203, package contact pads 205, bonding wires 204, solder bumps/contact pads 207, and conductors 206 are already present in an integrated circuit (IC). Moreover, conductive paths 202 and 208 can be formed with minimal silicon resources. Therefore, magnetic shielding loop 200 provides a space-effective solution to the magnetic coupling problem associated with LNA 201. Note that because of its partial formation on the third substrate, magnetic shielding loop 200 can provide additional protection from noise sources on the printed circuit board compared to magnetic shielding loop 100.

While magnetic shielding loops 100 and 200 can provide protection of a sensitive input from interference coupling into the circuit, the converse is also useful. For example, if a transmitter differential output were driven from the chip into a balun on a printed circuit board, a magnetic shielding loop could also be used to attenuate the RF energy coupling (leaking) from the transmitter to other circuits (on-chip or off-chip). An exemplary on-chip circuit prone to such interference from a transmitter is a voltage-controlled oscillator (VCO), particularly when it oscillates close to (but not right on) the RF output frequency.

Figure 3:
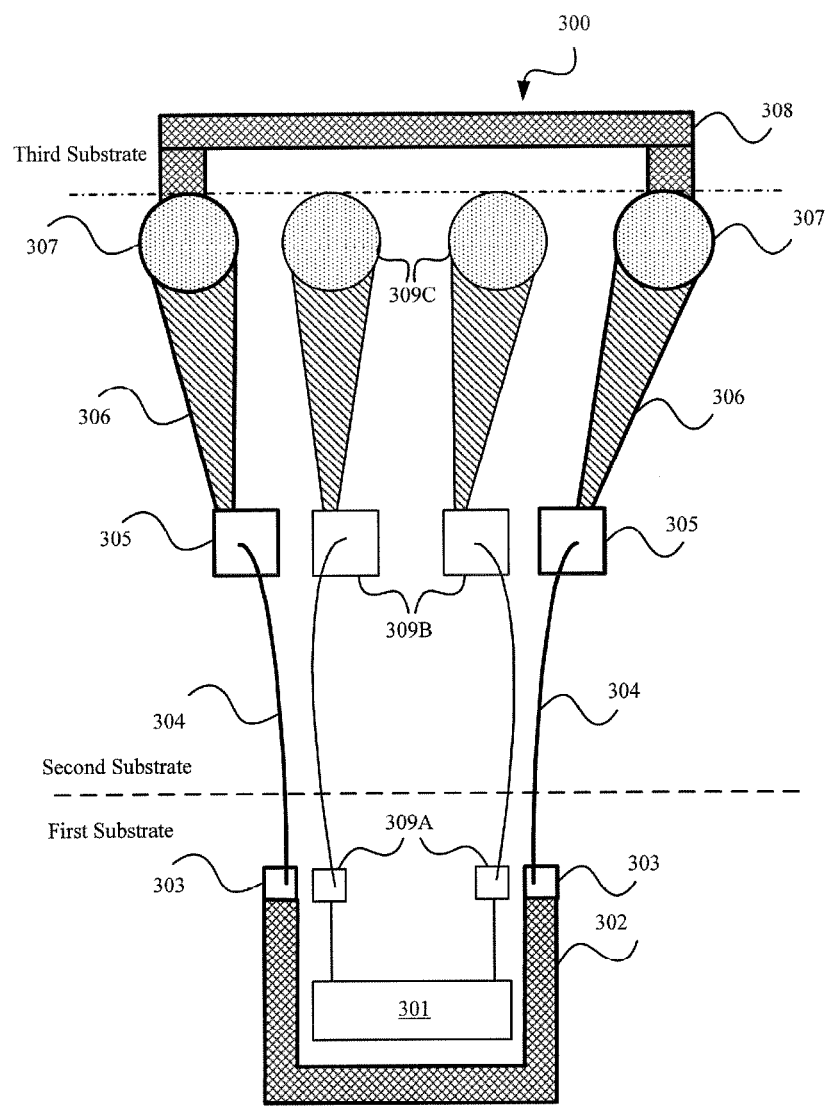
FIG. 3 illustrates an exemplary magnetic shielding loop that can magnetically isolate a noise-generating circuit using three substrates.

FIG. 3 illustrates an exemplary magnetic shielding loop 300 using three substrates that can protect the outputs of a noise-generating circuit, e.g. a power amplifier 301, from magnetic coupling with other on-chip and off-chip components. In this embodiment, magnetic shielding loop 300 can be formed using a first conductive on-chip path 302, chip contact pads 303 that are connected to first conductive on-chip path 302, package contact pads 305, bonding wires 304 that connect chip contact pads 303 and package contact pads 305, package solder bumps/contact pads 307, conductors 306 that connect package solder bumps/contact pads 307 and package contact pads 305, and a second conductive off-chip path 308 connected to package solder bumps/contact pads 307. In this embodiment, first conductive on-chip path 302 and chip contact pads 303 can be characterized as being formed with a first substrate (i.e. the die), package contact pads 305, conductors 306, and solder bumps/contact pads 307 can be characterized as being formed with a second substrate (i.e. the package), bonding wires 304 can be characterized as interfacing between the first and second substrates, and second conductive off-chip path 308 can be characterized as being formed with a third substrate (i.e. the printed circuit board).

Magnetic shielding loop 300 can magnetically isolate power amplifier 301, its output terminals 309A (on-chip)/309B (off-chip)/309C (off-chip), and the associated bonding wires and conductors of those output terminals from noise-sensitive circuits (not shown). That is, magnetic shielding loop 300 can provide magnetic isolation for power amplifier 301. Additionally, magnetic shielding loop 300 can collect the energy that is otherwise radiated from bondwires 304, thereby advantageously reducing output losses of power amplifier 301. In this manner, more useful energy can be delivered to the antenna, which would be connected to output terminals 309C on the printed circuit board.

Notably, chip contact pads 303, package contact pads 305, bonding wires 304, solder bumps/contact pads 307, and conductors 306 are already present in an integrated circuit (IC). Moreover, conductive paths 302 and 308 can be formed with minimal silicon resources. Therefore, magnetic shielding loop 300 provides a space-effective solution to the magnetic coupling problem associated with power amplifier 301.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, although magnetic shielding loops 100 and 200 are shown as separate embodiments, these loops can be used in combination to further enhance coupling protection. In one embodiment, a noise-generating circuit can be magnetically isolated using the loop configuration of FIG. 3A for the die substrate and the loop configuration of FIG. 1 for the package substrate (i.e. not using the printed circuit board substrate to complete the magnetic shielding loop configuration).

Note that although contact pads are discussed herein, other types of contacts, e.g. pins, leads, etc., can be used. Therefore, the generic term "contact" as used herein can refer to any type of contact pad, pin, lead, or other type of contact structure. Additionally, note that multiple bond wires can be used in parallel to form a better shielding loop (e.g. bonding wire 104 could represent multiple bonding wires). Accordingly, it is intended that the scope of the invention be defined by the following Claims and their equivalents.

The invention claimed is:

1. A structure minimizing magnetic coupling associated with a circuit on an integrated circuit, the structure comprising:
    on-chip components;
    off-chip components; and
    interface components connecting the on-chip components and the off-chip components to form a magnetic shielding loop, wherein the magnetic shielding loop magnetically isolates at least one of input terminals and noise-generating elements of the circuit.

2. A structure minimizing magnetic coupling associated with a circuit on an integrated circuit (IC), the structure comprising:
    a first conductive path formed in a die of the IC;
    a second conductive path formed in a package of the IC;
    conductive interface components to connect the first and second conductive paths and form a magnetic shielding loop, wherein the magnetic shielding loop magnetically isolates at least one of input terminals and noise-generating elements of the circuit.

3. The structure of claim 2, wherein the conductive interface components include:
    chip contacts connected to the first conductive path;
    package contacts connected to the second conductive path; and
    bonding wires connecting the chip contacts and the package contacts.

4. A structure minimizing magnetic coupling associated with a circuit on an integrated circuit (IC), the structure comprising:
    a first conductive path formed in a die of the IC;
    second conductive paths formed in a package housing the IC;
    a third conductive path formed in a printed circuit board for mounting the IC; and
    conductive interface components to connect the first, second, and third conductive paths and form a magnetic shielding loop, wherein the magnetic shielding loop magnetically isolates at least one of input terminals and noise-generating elements of the circuit.

5. The structure of claim 4, wherein the conductive interface components include:
    chip contacts connected to the first conductive path;
    package contacts connected to the second conductive path;
    bonding wires connecting the chip contacts and the package contacts;
    package solder bumps/contacts connected to the third conductive path; and
    conductors connecting the package contacts and the package solder bumps/contacts.

6. A structure minimizing magnetic coupling associated with a circuit on an integrated circuit (IC), the structure comprising:
    first conductive components in a first substrate;
    second conductive components in a second substrate; and
    third conductive components for connecting the first and second conductive components to create a magnetic shielding loop for at least one of input terminals and noise-generating elements of the circuit.

7. The structure of claim 6, further including:
    fourth conductive components in a third substrate; and
    fifth conductive components for connecting the second and fourth conductive components.

8. A method of minimizing magnetic coupling associated with a circuit on an integrated circuit (IC), the method comprising:
    creating a magnetic shielding loop spanning a plurality of substrates, wherein the plurality of substrates include at least a die substrate and a package substrate.

9. The method of claim 8, wherein the plurality of substrates include the die substrate, the package substrate, and a printed circuit board substrate.

* * * * *